United States Patent
Hosokawa et al.

(10) Patent No.: US 12,421,162 B2
(45) Date of Patent: *Sep. 23, 2025

(54) GLASS COMPOSITION FOR GLASS FIBERS, GLASS FIBER, GLASS FIBER WOVEN FABRIC, AND GLASS-FIBER-REINFORCED RESIN COMPOSITION

(71) Applicant: NITTO BOSEKI CO., LTD., Fukushima (JP)

(72) Inventors: Takanobu Hosokawa, Koriyama (JP); Ryo Nishikubo, Koriyama (JP); Yoichi Hiraishi, Koriyama (JP); Tadashi Kurita, Koriyama (JP)

(73) Assignee: Nitto Boseki Co., Ltd., Fukushima (JP)

(*) Notice: Subject to any disclaimer, the term of this patent is extended or adjusted under 35 U.S.C. 154(b) by 0 days.

This patent is subject to a terminal disclaimer.

(21) Appl. No.: 18/704,194

(22) PCT Filed: Feb. 14, 2024

(86) PCT No.: PCT/JP2024/004910
§ 371 (c)(1),
(2) Date: Apr. 24, 2024

(87) PCT Pub. No.: WO2024/181119
PCT Pub. Date: Sep. 6, 2024

(65) Prior Publication Data
US 2025/0178952 A1  Jun. 5, 2025

(30) Foreign Application Priority Data
Feb. 28, 2023 (JP) .................... 2023-029848

(51) Int. Cl.
*C03C 13/00* (2006.01)
*C03C 3/097* (2006.01)
*C08J 5/04* (2006.01)

(52) U.S. Cl.
CPC ............. *C03C 13/00* (2013.01); *C03C 3/097* (2013.01); *C08J 5/043* (2013.01); *C03C 2213/00* (2013.01)

(58) Field of Classification Search
CPC ..... C03C 13/00; C03C 3/097; C03C 2213/00; C08J 5/043
See application file for complete search history.

(56) References Cited

U.S. PATENT DOCUMENTS

| | | | |
|---|---|---|---|
| 9,878,942 B2 | 1/2018 | Nonaka et al. | |
| 2005/0085369 A1 | 4/2005 | Jensen | |
| 2009/0312171 A1 | 12/2009 | Tanaka | |
| 2015/0119227 A1* | 4/2015 | Sawai | C03C 1/004 501/32 |
| 2020/0325066 A1* | 10/2020 | Murayama | C03C 3/095 |
| 2022/0153628 A1 | 5/2022 | Lin | |
| 2023/0399252 A1 | 12/2023 | Nukui et al. | |
| 2024/0417315 A1* | 12/2024 | Nishikubo | C03C 13/00 |

FOREIGN PATENT DOCUMENTS

| | | | |
|---|---|---|---|
| CN | 115087626 A | 9/2022 | |
| JP | 2005-511471 A | 4/2005 | |
| JP | 2007-039320 A | 2/2007 | |
| JP | 2014-234319 A | 12/2014 | |
| JP | 5988013 B1 | 9/2016 | |
| JP | 2020-105683 A | 7/2020 | |
| JP | 2022-079402 A | 5/2022 | |
| WO | 2023/276618 A1 | 1/2023 | |
| WO | WO-2023228594 A1 * | 11/2023 | ............. C03C 13/00 |

OTHER PUBLICATIONS

Office Action dated Apr. 4, 2025 issued in the corresponding Chinese Patent Application No. 202480000819.X with the English machine translation thereof.

* cited by examiner

*Primary Examiner* — Jenna N Chandhok
(74) *Attorney, Agent, or Firm* — Carrier, Shende & Associates P.C.; Joseph P. Carrier; Fulchand P. Shende

(57) ABSTRACT

Provided is a glass composition for glass fiber that enables molten glass with a low 1000 poise temperature, a wide working temperature range, and suppressed phase separation to be obtained, and that enables, when glass fiber is produced using the molten glass, glass fiber with a low coefficient of linear thermal expansion without deteriorating spinnability even if mass production is performed over a long period of time. The glass composition for glass fiber of the present invention includes 42.00 to 63.00% by mass of $SiO_2$, 19.00 to 27.30% by mass of $Al_2O_3$, more than 3.00% by mass and 13.00% by mass or less of ZnO, 6.50 to 19.00% by mass of $P_2O_5$, 0.00 to 7.00% by mass of MgO, and 1.00% by mass or less in total of $Li_2O$, $Na_2O$, and $K_2O$, with respect to the total amount.

5 Claims, No Drawings

GLASS COMPOSITION FOR GLASS FIBERS, GLASS FIBER, GLASS FIBER WOVEN FABRIC, AND GLASS-FIBER-REINFORCED RESIN COMPOSITION

TECHNICAL FIELD

The present invention relates to a glass composition for glass fiber, glass fiber, a glass fiber woven fabric, and a glass fiber-reinforced resin composition.

BACKGROUND ART

Glass fiber is manufactured by melting a glass raw material prepared so as to be a glass composition for glass fiber having a desired composition in a glass melting furnace to form molten glass (a melt of the glass composition for glass fiber); discharging the molten glass from a container (bushing) having a nozzle plate on which several to thousands of nozzle tips are formed; and cooling the discharged molten glass while stretching by winding at a high speed to solidify it into fiber (hereinafter, this operation is sometimes referred to as "spinning"). The above bushing is formed from a noble metal such as platinum.

Conventionally, glass fiber has been widely used to improve the strength of resin compositions, and the resin compositions have been increasingly used for a housing or a part of electronic devices such as a server, a smartphone, a laptop computer, and the like. In recent years, as the electronic devices have become smaller and lighter, printed circuit boards used in the electronic devices have become thinner, and the printed circuit boards are required not only to have high rigidity but also to have excellent dimensional stability. Therefore, glass fiber used for reinforcing the printed circuit boards is particularly required to have a low coefficient of linear thermal expansion.

S-glass composition is known as a glass fiber composition with a high elastic modulus and a low coefficient of linear thermal expansion. However, glass compositions for glass fiber with S glass composition has a high liquid phase temperature, which means that the temperature of the molten glass must be kept high during the production of glass fiber. In order to solve the problem, the present applicant has proposed a glass composition for glass fiber that can lower the liquid phase temperature while maintaining a high elastic modulus of the glass fiber formed (see, for example, Patent Literature 1).

However, the glass composition for glass fiber described in Patent Literature 1 has a high elastic modulus of the glass fiber formed, but has a problem that the coefficient of linear thermal expansion is not sufficiently low. In order to solve the problem in the glass composition for glass fiber described in Patent Literature 1, the present applicant has further proposed a glass composition for glass fiber that can achieve both a high elastic modulus and a low coefficient of linear thermal expansion of the glass fiber formed while suppressing an increase in the liquid phase temperature (see Japanese Patent Application No. 2022-083983).

The glass composition for glass fiber described in Japanese Patent Application No. 2022-083983 can be spun without any problem as long as the production is for a short period of time and in small quantities, and a high elastic modulus and a low coefficient of linear thermal expansion of the glass composition for glass fiber can both be achieved while suppressing an increase in the liquid phase temperature.

CITATION LIST

Patent Literature

Patent Literature 1: Japanese Patent No. 5988013

SUMMARY OF INVENTION

Technical Problem

However, the glass composition for glass fiber described in Japanese Patent Application No. 2022-083983 has a disadvantage that the molten glass may be crystallized inside the bushing, deteriorating the spinnability when glass fiber is industrially produced in large quantities over a long period of time.

The present inventors have examined a reason for the crystallization of the molten glass inside the bushing, and the reason is considered to be as follows.

First, in order to produce glass fiber in large quantities at low cost, it is necessary to increase the number of nozzle tips formed on the nozzle plate, for example, the number of nozzle tips needs to be 100 or more, but in order to increase the number of nozzle tips, the volume of the bushing needs to be increased. However, as the bushing volume is increased, the temperature bias inside the bushing is increased. In addition, when produced for a long period of time, some molten glass stays in a region with a relatively low temperature inside the bushing for a long period of time. Then, even if the crystallization rate of the molten glass is sufficiently slow, it is eventually crystallized in the case where the difference between the spinning temperature (1000 poise temperature) and the liquid phase temperature (working temperature range) is small. If crystallized molten glass flows inside the nozzle tips, the nozzles may become blocked by the crystals (sometimes referred to as "nozzle clogging"), resulting in spinning cuts and making it difficult to continue production.

Furthermore, depending on the glass composition, phase separation may occur. The phase separation is a phase separation phenomenon in which a single phase of molten glass forms glass phases with different compositions due to heat and other factors. When the phase separation occurs, the chemical durability of glass fibers is decreased, and in the case where the occurrence of phase separation is particularly pronounced, it may be difficult to convert the molten glass into fibers.

As a result, as mentioned above, it is considered that the disadvantage of possible deterioration of spinnability occurs.

An object of the present invention is, by eliminating the disadvantage, to provide a glass composition for glass fiber that enables molten glass with a low 1000 poise temperature, a wide working temperature range, and suppressed phase separation to be obtained, and that enables, when glass fiber is produced using the molten glass, glass fiber with a low coefficient of linear thermal expansion.

Another object of the present invention is to provide glass fiber formed from the glass composition for glass fiber of the present invention, as well as a glass fiber woven fabric and a glass fiber-reinforced resin composition using the glass fiber.

Solution to Problem

In order to achieve the object, the glass composition for glass fiber of the present invention includes $SiO_2$ in the range of 42.00 to 63.00% by mass, $Al_2O_3$ in the range of 19.00 to 27.30% by mass, ZnO in the range of more than 3.00% by mass and 13.00% by mass or less, $P_2O_5$ in the range of 6.50 to 19.00% by mass, MgO in the range of 0.00 to 7.00% by mass, and $Li_2O$, $Na_2O$, and $K_2O$ in the range of 1.00% by mass or less in total, with respect to the total amount.

According to the glass composition for glass fiber of the present invention, by including $SiO_2$, $Al_2O_3$, ZnO, $P_2O_5$, MgO, $Li_2O$, $Na_2O$, and $K_2O$ in the respective ranges described above, a glass composition for glass fiber with a low coefficient of linear thermal expansion can be obtained that enables molten glass with a low 1000 poise temperature, a wide working temperature range, and suppressed phase separation to be obtained.

Here, the low 1000 poise temperature means that the 1000 poise temperature of molten glass is 1520° C. or lower, the wide working temperature range means that the working temperature range is 0° C. or more, and the suppressed phase separation means that no phase separation is observed when evaluated by the method described later. In addition, the glass composition for glass fiber with a low coefficient of linear thermal expansion being obtainable means that the coefficient of linear thermal expansion of the resulting glass composition for glass fiber is 3.0 ppm/° C. or less.

The evaluation of phase separation can be performed by the following method. First, a glass raw material prepared to have the composition of the glass composition for glass fiber of the present invention (glass batch) is placed in an 80 mm diameter platinum crucible, melted by heating at a temperature of 1650° C. for 6 hours, and then taken out of the platinum crucible to obtain homogeneous glass bulk or glass cullet. The obtained glass bulk or glass cullet is then annealed by heating at a temperature of 750° C. for 8 hours to obtain a test piece. Next, the test piece is processed into a disc shape using a cutting machine such as diamond cutter and a polisher. Then, the test piece that has been processed into a disc shape is placed on the boundary between a black plate and a white plate, and the boundary surface between the black plate and the white plate is observed through the test piece from the top of the test piece. In the case where there is no cloudiness in the test piece and the boundary surface can be clearly observed, the evaluation is that no phase separation is observed.

Also, the glass composition for glass fiber of the present invention preferably includes ZnO in the range of 5.10 to 10.00% by mass, $P_2O_5$ in the range of more than 8.00% by mass and 15.50% by mass or less, and $B_2O_3$ in the range of 1.00 to 4.80% by mass, with respect to the total amount.

When the glass composition for glass fiber of the present invention includes ZnO, $P_2O_5$, and $B_2O_3$ in the respective ranges described above, the working temperature range is wider, and a glass composition for glass fiber with a lower coefficient of linear thermal expansion can be obtained. Here, the working temperature range being wider means that the working temperature range is 40° C. or more, and the glass composition for glass fiber with a lower coefficient of linear thermal expansion being obtainable means that the coefficient of linear thermal expansion of the resulting glass composition for glass fiber is 2.2 ppm/° C. or less.

Also, the glass composition for glass fiber of the present invention more preferably includes ZnO in the range of 7.00 to 8.80% by mass and $P_2O_5$ in the range of 9.50 to 13.50% by mass, with respect to the total amount.

When the glass composition for glass fiber of the present invention includes ZnO and $P_2O_5$ in the respective ranges described above, the working temperature range is further wider. Here, the working temperature range being further wider means that the working temperature range is 60° C. or more.

Also, the glass fiber of the present invention is formed from the glass composition for glass fiber of the present invention. Also, the glass fiber woven fabric of the present invention includes the glass fiber of the present invention, and the glass fiber-reinforced resin composition of the present invention includes the glass fiber of the present invention.

DESCRIPTION OF EMBODIMENTS

Hereinafter, embodiments of the present invention will be described in detail.

The glass composition for glass fiber of the present embodiment includes $SiO_2$ in the range of 42.00 to 63.00% by mass, $Al_2O_3$ in the range of 19.00 to 27.30% by mass, ZnO in the range of more than 3.00% by mass and 13.00% by mass or less, $P_2O_5$ in the range of 6.50 to 19.00% by mass, MgO in the range of 0.00 to 7.00% by mass, and $Li_2O$, $Na_2O$, and $K_2O$ in the range of 1.00% by mass or less in total, with respect to the total amount.

According to the glass composition for glass fiber of the present embodiment, by including $SiO_2$, $Al_2O_3$, ZnO, $P_2O_5$, MgO, $Li_2O$, $Na_2O$, and $K_2O$ in the respective ranges described above, a glass composition for glass fiber with a low coefficient of linear thermal expansion can be obtained that enables molten glass with a low 1000 poise temperature, a wide working temperature range, and suppressed phase separation to be obtained.

In the glass composition for glass fiber of the present embodiment, when the content of $SiO_2$ is less than 42.00% by mass with respect to the total amount of the glass composition for glass fiber, the working temperature range is narrowed and crystals may be crystallized during spinning, resulting in nozzle blockage. Also, when the content of $SiO_2$ is more than 63.00% by mass, the 1000 poise temperature is higher and the meltability is deteriorated.

In the glass composition for glass fiber of the present embodiment, the content of $SiO_2$ with respect to the total amount of the glass composition for glass fiber is preferably in the range of 44.00 to 60.00% by mass, more preferably in the range of 45.80 to 55.90% by mass, still more preferably in the range of 47.30 to 54.90% by mass, particularly preferably in the range of 47.90 to 54.30% by mass, and especially preferably in the range of 48.90 to 53.30% by mass.

In the glass composition for glass fiber of the present embodiment, when the content of $Al_2O_3$ is less than 19.00% by mass with respect to the total amount of the glass composition for glass fiber, the 1000 poise temperature is higher and the meltability is deteriorated. Also, when the content of $Al_2O_3$ is more than 27.30% by mass, the working temperature range is narrowed and the spinnability is deteriorated.

In the glass composition for glass fiber of the present embodiment, the content of $Al_2O_3$ with respect to the total amount of the glass composition for glass fiber is preferably in the range of 19.50 to 26.40% by mass, more preferably in the range of 20.50 to 25.80% by mass, still more preferably in the range of 22.10 to 25.30% by mass, particularly preferably in the range of 22.60 to 24.90% by mass, and especially preferably in the range of 23.20 to 24.40% by mass.

In the glass composition for glass fiber of the present embodiment, when the content of ZnO is 3.00% by mass or less with respect to the total amount of the glass composition for glass fiber, the 1000 poise temperature is higher and the meltability is deteriorated. Also, when the content of ZnO is more than 13.00% by mass, glass fiber with a low coefficient of linear thermal expansion cannot be obtained.

In the glass composition for glass fiber of the present embodiment, the content of ZnO with respect to the total amount of the glass composition for glass fiber is preferably in the range of 3.10 to 12.50% by mass, and more preferably in the range of 4.10 to 11.40% by mass.

In the glass composition for glass fiber of the present embodiment, when the content of $P_2O_5$ is less than 6.50% by mass with respect to the total amount of the glass composition for glass fiber, the working temperature range is narrowed and crystals may be crystallized during spinning, resulting in nozzle blockage. Also, when the content of $P_2O_5$ is more than 19.00% by mass, the 1000 poise temperature is higher, the meltability is deteriorated, and the liquid phase temperature is higher, making it difficult to perform spinning.

In the glass composition for glass fiber of the present embodiment, the content of $P_2O_5$ with respect to the total amount of the glass composition for glass fiber is preferably in the range of 7.10 to 17.00% by mass.

In the glass composition for glass fiber of the present embodiment, when the content of MgO is more than 7.00% by mass with respect to the total amount of the glass composition for glass fiber, glass fiber with a low coefficient of linear thermal expansion cannot be obtained.

In the glass composition for glass fiber of the present embodiment, the content of MgO with respect to the total amount of the glass composition for glass fiber is preferably in the range of 0.00 to 5.90% by mass, more preferably in the range of 0.50 to 4.90% by mass, still more preferably in the range of 1.10 to 3.50% by mass, particularly preferably in the range of 1.50 to 2.90% by mass, especially preferably in the range of 1.90 to 2.70% by mass, and markedly preferably in the range of 2.10 to 2.60% by mass.

In the glass composition for glass fiber of the present embodiment, when the total content of $Li_2O$, $Na_2O$, and $K_2O$ is more than 1.00% by mass with respect to the total amount of the glass composition for glass fiber, the water resistance of glass fiber formed from the glass composition for glass fiber is deteriorated, and glass fiber with a low coefficient of linear thermal expansion cannot be obtained.

In the glass composition for glass fiber of the present embodiment, the total content of $Li_2O$, $Na_2O$, and $K_2O$ with respect to the total amount of the glass composition for glass fiber is preferably in the range of 0.50% by mass or less, more preferably in the range of less than 0.10% by mass, still more preferably in the range of 0.05% by mass or less, particularly preferably in the range of 0.03% by mass or less, especially preferably in the range of 0.02% by mass or less, and especially preferably in the range of 0.01% by mass or less.

In the glass composition for glass fiber of the present embodiment, the content of $B_2O_3$ with respect to the total amount of the glass composition for glass fiber is, from the viewpoint of increasing the elastic modulus and obtaining glass fiber with a low coefficient of linear thermal expansion, preferably in the range of 10.00% by mass or less, more preferably in the range of 7.90% by mass or less, still more preferably in the range of 0.50 to 5.90% by mass, particularly preferably in the range of 1.00 to 4.80% by mass, and especially preferably in the range of 1.50 to 3.50% by mass.

Also, the glass composition for glass fiber of the present embodiment preferably includes ZnO in the range of 5.10 to 10.00% by mass, $P_2O_5$ in the range of more than 8.00% by mass and 15.50% by mass or less, and $B_2O_3$ in the range of 1.00 to 4.80% by mass, with respect to the total amount of the glass composition for glass fiber. When the glass composition for glass fiber of the present embodiment includes ZnO, $P_2O_5$, and $B_2O_3$ in the respective ranges described above with respect to the total amount of the glass composition for glass fiber, the working temperature range is wider, and glass fiber with a lower coefficient of linear thermal expansion can be obtained.

At this time, the content of ZnO with respect to the total amount of the glass composition for glass fiber is more preferably in the range of 5.10 to 10.00% by mass, and still more preferably in the range of 6.30 to 9.40% by mass. Also, the content of $P_2O_5$ with respect to the total amount of the glass composition for glass fiber is more preferably in the range of 8.60 to 14.90% by mass.

Furthermore, the glass composition for glass fiber of the present embodiment more preferably includes ZnO in the range of 7.00 to 8.80% by mass and $P_2O_5$ in the range of 9.50 to 13.50% by mass, with respect to the total amount of the glass composition for glass fiber. When the glass composition for glass fiber of the present embodiment includes ZnO and $P_2O_5$ in the respective ranges described above with respect to the total amount of the glass composition for glass fiber, the working temperature range is further widened while being able to obtain glass fiber with a low coefficient of linear thermal expansion. At this time, the content of ZnO with respect to the total amount of the glass composition for glass fiber is particularly preferably in the range of 7.70 to 8.80% by mass, and especially preferably in the range of 7.20 to 8.30% by mass. Also, the content of $P_2O_5$ with respect to the total amount of the glass composition for glass fiber is especially preferably in the range of 10.50 to 13.60% by mass, and markedly preferably in the range of 11.00 to 13.30% by mass.

Also, in the glass composition for glass fiber of the present embodiment, the ratio of the content of $P_2O_5$ to the content of ZnO ($P_2O_5$/ZnO) is preferably in the range of 0.40 to 5.60. When the ratio of the content of $P_2O_5$ to the content of ZnO ($P_2O_5$/ZnO) is less than 0.40, there is a tendency that the working temperature range is smaller or the coefficient of linear thermal expansion of glass fiber formed from the glass composition for glass fiber is larger, and when the ratio is more than 5.60, there is a tendency that the 1000 poise temperature is too high. The ratio of the content of $P_2O_5$ to the content of ZnO ($P_2O_5$/ZnO) is more preferably in the range of 0.70 to 4.50, still more preferably in the range of 0.80 to 3.70, particularly preferably in the range of 0.90 to 2.80, and especially preferably in the range of 0.95 to 2.00.

Also, in the glass composition for glass fiber of the present embodiment, the ratio of the total content of $Li_2O$, $Na_2O$, and $K_2O$ to the content of $Al_2O_3$ (($Li_2O+Na_2O+K_2O$)/$Al_2O_3$) is, from the viewpoint of improving the chemical durability and the water resistance of glass fiber, preferably in the range of less than 0.10, more preferably in the range of less than 0.05, still more preferably in the range of less than 0.03, and particularly preferably in the range of less than 0.01.

In addition, from the viewpoint of lowering the liquid phase temperature and improving the meltability, the glass composition for glass fiber of the present embodiment may also include CaO. In the case where CaO is included, the content of CaO with respect to the total amount of the glass composition for glass fiber is, for example, in the range of 0.00 to 5.00% by mass, preferably in the range of 0.00 to 2.50% by mass, more preferably in the range of 0.00 to 0.90% by mass, still more preferably in the range of 0.00 to 0.40% by mass, and particularly preferably in the range of 0.00% by mass or more and less than 0.10% by mass.

In addition, from the viewpoint of lowering the melt viscosity and improving the spinning workability while maintaining a low coefficient of linear thermal expansion, the glass composition for glass fiber of the present embodiment may also include $TiO_2$. In the case where $TiO_2$ is included, the content of $TiO_2$ with respect to the total amount of the glass composition for glass fiber is, for example, in the range of 0.00 to 5.00% by mass, preferably in the range of 0.00 to 2.50% by mass, more preferably in the range of 0.00 to 1.80% by mass, still more preferably in the range of 0.00 to 0.90% by mass, and particularly preferably in the range of 0.00 to 0.40% by mass.

In addition, from the viewpoint of reducing the melt viscosity of molten glass and facilitating the formation of longer fibers, the glass composition for glass fiber of the present embodiment may also include $ZrO_2$. In the case where $ZrO_2$ is included, the content of $ZrO_2$ with respect to the total amount of the glass composition for glass fiber is, for example, in the range of 3.00% by mass or less, preferably in the range of 1.00% by mass or less, more preferably in the range of 0.60% by mass or less, still more preferably in the range of 0.40% by mass or less, particularly preferably in the range of 0.20% by mass or less, especially preferably in the range of 0.10% by mass or less, and markedly preferably in the range of 0.001% by mass or less.

In addition, from the viewpoint of enhancing the defoamability of molten glass and enhancing the stability of the formation of longer fibers, the glass composition for glass fiber of the present embodiment may also include $F_2$ and $Cl_2$. In the case where $F_2$ and $Cl_2$ are included, the total content of $F_2$ and $Cl_2$ with respect to the total amount of the glass composition for glass fiber is, for example, in the range of 3.00% by mass or less, preferably in the range of 1.00% by mass or less, more preferably in the range of 0.40% by mass or less, still more preferably in the range of 0.20% by mass or less, particularly preferably in the range of 0.10% by mass or less, and especially preferably in the range of 0.001% by mass or less.

Furthermore, the glass composition for glass fiber of the present embodiment may include, as impurities attributable to raw materials, oxides of Sr, Ba, Mn, Co, Ni, Cu, Cr, Mo, W, Ce, Y, La, Bi, Gd, Pr, Sc, or Yb in the range of less than 3.00% by mass, preferably in the range of less than 2.00% by mass, and more preferably in the range of less than 1.00% by mass, in total with respect to the total amount of the glass composition for glass fiber.

In particular, in the case where the glass composition for glass fiber of the present embodiment includes SrO, BaO, $CeO_2$, $Y_2O_3$, $La_2O_3$, $Bi_2O_3$, $Gd_2O_3$, $Pr_2O_3$, $Sc_2O_3$, or $Yb_2O_3$ as impurities, the content thereof with respect to the total amount of the glass composition for glass fiber is each independently preferably in the range of less than 0.40% by mass, more preferably in the range of less than 0.20% by mass, still more preferably in the range of less than 0.10% by mass, particularly preferably in the range of less than 0.05% by mass, especially preferably in the range of less than 0.01% by mass, and markedly preferably in the range of less than 0.001% by mass.

Also, in particular, in the case where the glass composition for glass fiber of the present embodiment includes MgO, CaO, SrO, and BaO, the total content of MgO, CaO, SrO, and BaO with respect to the total amount of the glass composition for glass fiber is preferably in the range of 0.00 to 7.00% by mass, more preferably in the range of 0.00 to 5.90% by mass, still more preferably in the range of 0.50 to 4.90% by mass, particularly preferably in the range of 1.10 to 3.50% by mass, and especially preferably in the range of 1.50 to 2.90% by mass.

Regarding the content of each component in the glass composition for glass fiber, the content of Li as the light element can be measured using an ICP emission spectroscopic analyzer. The contents of the other elements can be measured using a wavelength dispersive X-ray fluorescence analyzer.

Examples of the measurement method can include the following method. First, a glass batch is placed in a platinum crucible and in an electric furnace, melted with stirring while being held at a temperature of 1650° C. for 6 hours to obtain a homogeneous molten glass. Alternatively, glass fiber is placed in a platinum crucible and melted with stirring while being held at a temperature of 1650° C. for 6 hours in an electric furnace to obtain a homogeneous molten glass.

The glass batch is prepared by mixing a glass raw material. When organic matter adheres to the surface of the glass fiber, or when glass fiber is mainly included as a reinforcing material in organic matter (resin), the glass fiber is used after the organic matter is removed by, for example, heating for about 0.5 to 24 hours in a muffle furnace at 300 to 650° C.

Next, the obtained molten glass is poured onto a carbon plate to produce a glass cullet, and then the glass cullet is pulverized and powdered to obtain glass powder.

Next, regarding Li as a light element, the glass powder is thermally decomposed with an acid and then quantitatively analyzed using an ICP emission spectroscopic analyzer. Regarding other elements, the glass powder is molded into a disc shape by a pressing machine and then quantitatively analyzed using a wavelength dispersive X-ray fluorescence analyzer. For the quantitative analysis using a wavelength dispersive X-ray fluorescence analyzer, specifically, specimens for calibration curve are prepared based on the measurement results from the fundamental parameter method, and the analysis can be performed by the calibration curve method. The content of each component in the specimens for calibration curve can be quantitatively analyzed by an ICP emission spectroscopic analyzer. These quantitative analysis results are converted in terms of oxides to calculate the content of each component and the total amount, and the above content (% by mass) of each component can be determined from these numerical values.

According to the glass composition for glass fiber of the present embodiment, the 1000 poise temperature is, for example, a temperature in the range of 1520° C. or lower, preferably a temperature in the range of 1500° C. or lower, and the lower limit is not particularly restricted, but is more preferably a temperature in the range of 1350 to 1490° C. still more preferably a temperature in the range of 1400 to 1480° C.

The 1000 poise temperature can be measured as follows. First, the glass batch is placed in an 80 mm diameter platinum crucible, held in an electric furnace for 4 hours at a temperature in the range of 1500 to 1650° C., and melted while stirring the glass batch to obtain a homogeneous molten glass. Next, the obtained molten glass is poured onto a carbon plate and cooled to obtain a bulk glass cullet. Then, the glass cullet was melted, and the viscosity of the molten glass is continuously measured using a Brookfield rotational viscometer while the melt temperature is varied. The temperature at which the rotational viscosity is 1000 poise is defined as the 1000 poise temperature.

According to the glass composition for glass fiber of the present embodiment, the liquid phase temperature is preferably a temperature in the range of 1500° C. or lower, and the lower limit is not particularly restricted, but the liquid phase temperature is more preferably a temperature in the range of 1300 to 1470° C., still more preferably a temperature in the range of 1320 to 1430° C., particularly preferably a temperature in the range of 1330 to 1420° C., and especially preferably a temperature in the range of 1340 to 1400° C.

The liquid phase temperature can be measured as follows. First, the glass cullet is pulverized, 40 g of glass particles having a particle diameter in the range of 0.5 to 1.5 mm is placed in a platinum boat of 180 mm×20 mm×15 mm and heated in a tubular electric furnace provided with a temperature gradient in the range of 900 to 1550° C. for 8 hours or longer, then taken out of the tubular electric furnace, and observed with a polarized light microscope to identify the point at which crystals derived from glass (devitrification) began to precipitate. Then, the temperature inside the tubular electric furnace is actually measured using a type B thermocouple, and the temperature of the point at which the crystals derived from the glass began to precipitate is defined as the liquid phase temperature.

According to the glass composition for glass fiber of the present embodiment, the working temperature range is, for example, a temperature in the range of 0° C. or more, preferably in the range of 20° C. or more, more preferably in the range of 40° C. or more, and still more preferably in the range of 60° C. or more, and the upper limit is not particularly restricted, but is particularly preferably a temperature in the range of 80 to 200° C., and especially preferably a temperature in the range of 100 to 180° C.

The working temperature range can be calculated as the difference between the 1000 poise temperature and the liquid phase temperature as measured by the aforementioned methods (working temperature range=1000 poise temperature−liquid phase temperature).

The glass fiber of the present embodiment can be formed from the glass composition for glass fiber of the present embodiment, for example, as follows. First, a glass raw material is prepared to be the composition of the glass composition for glass fiber of the present embodiment, based on the components contained in the ore to be the glass raw material, the content of each component, and the amount of each component volatilized during the melting process. Next, the prepared glass raw material (glass batch) is supplied to a melting furnace, and is melted at a temperature range of 1000 poise temperature or higher, specifically a temperature in the range of 1450 to 1650° C. Then, the glass batch (molten glass) melted at the temperature range described above is discharged from 100 to 8000 nozzle tips or holes of the bushing controlled at a predetermined temperature, and cooled while stretched by winding at high speed to form glass single fiber (glass filament) by solidification.

When forming the glass fiber of the present embodiment, glass filament discharged from one nozzle tip or hole, cooled and solidified typically has a perfect circle cross-sectional shape and has a diameter in the range of 2.0 to 35.0 μm. In applications that require a low coefficient of linear thermal expansion, the glass filament preferably has a diameter in the range of 3.0 to 6.0 μm and more preferably a diameter in the range of 3.0 to 4.5 μm. On the other hand, when the above nozzle tip has a non-circular shape and has a protrusion or a notch for rapidly cooling the molten glass, controlling the temperature condition can provide a glass filament having a non-circular (for example, elliptical and long-oval) cross-sectional shape. When the glass filament has an elliptical or long-oval cross-sectional shape, the ratio of the major axis to the minor axis of the cross-sectional shape (major axis/minor axis) is, for example, in the range of 2.0 to 10.0 and the fiber diameter (converted fiber diameter) when the cross-sectional area is converted to a perfect circle is, for example, in the range of 2.0 to 35.0 μm.

The glass fiber of the present embodiment typically has a shape of a glass fiber bundle (glass strand) in which the above glass filaments in the range of 10 to 8000 filaments are bundled, and has a weight in the range of 0.3 to 10000.0 tex (g/km).

The glass fiber of the present embodiment can have various forms, which are obtained by further processing the above glass strands, such as yarns, woven fabrics, knitted fabrics, non-woven fabrics (including chopped strand mats and multiaxial non-woven fabrics), chopped strands, rovings, and powders.

According to the glass composition for glass fiber of the present embodiment, the elastic modulus is preferably in the range of 75.0 GPa or more, more preferably in the range of 78.0 GPa or more, and still more preferably in the range of 79.0 GPa or more, and the upper limit is not particularly restricted, but is particularly preferably in the range of 80.0 to 90.0 GPa, and especially preferably in the range of 81.0 to 86.0 GPa.

The elastic modulus can be measured as follows. First, the glass batch is placed in an 80 rum diameter platinum crucible, melted by heating at a temperature of 1650° C. for 6 hours, and then taken out of the platinum crucible to obtain homogeneous glass bulk or glass cullet. The obtained glass bulk or glass cullet is then annealed by heating at a temperature of 750° C. for 8 hours to obtain a test piece. Next, the test piece is processed into a test piece for elastic modulus measurement of 50 mm×50 mm×5 mm using a cutting machine such as diamond cutter and a polisher, and using the test piece for elastic modulus measurement, the elastic modulus is measured by the ultrasonic pulse method according to JIS R 1602:1995.

Also, according to the glass composition for glass fiber of the present embodiment, the coefficient of linear thermal expansion is, for example, in the range of 3.0 ppm/° C. or less, preferably in the range of 2.9 ppm/° C. or less, and more preferably in the range of less than 2.5 ppm/° C., and the lower limit is not particularly restricted, but is still more preferably in the range of 1.5 to 2.3 ppm/° C., and particularly preferably in the range of 1.8 to 2.2 ppm/° C.

The coefficient of linear thermal expansion can be measured as follows. First, a test piece obtained in the same manner as in the case of the elastic modulus measurement described above is processed into a test piece for coefficient of linear thermal expansion measurement of 4 mm×4 mm×20 mm using a cutting machine such as diamond cutter and a polisher. Next, the obtained test piece for coefficient of linear thermal expansion measurement is heated at a temperature increase rate of 10° C./min, and the amount of elongation is measured using a coefficient of thermal expansion measuring apparatus (manufactured by NETZSCH, trade name: DIL 402) at a temperature in the range of 50 to 200° C. From the amount of elongation, the coefficient of linear thermal expansion is calculated.

The glass fiber of the present embodiment may be coated with an organic matter on the surface thereof for the purposes such as improvement of glass filament convergence, improvement of adhesiveness between glass fiber and a resin, and improvement of uniform dispersibility of glass fiber in a mixture of glass fiber and resin or inorganic material. Examples of such an organic matter can include starch, urethane resins, epoxy resins, vinyl acetate resins, acrylic resins, modified polypropylene (particularly carboxylic acid-modified polypropylene), and a copolymer of (poly)carboxylic acid (particularly maleic acid) and an unsaturated monomer. The glass fiber of the present embodiment may be coated with the resin composition including a silane coupling agent, a lubricant, surfactant, and the like in addition to these resins. The glass fiber of the present embodiment may be coated with the treating agent composition not including the above resins and including a silane coupling agent, surfactant, and the like.

Such a resin composition or treating agent composition covers the glass fiber at a rate in the range of 0.1 to 2.0% by mass based on the mass of the glass fiber of the present embodiment in a state where it is not coated with the resin composition or the treating agent composition. The glass fiber can be coated with the organic matter by applying a resin solution or a resin composition solution to the glass fiber using a known method such as a roller applicator, for example, in the manufacturing process of the glass fiber and then drying the glass fiber to which the resin solution or the resin composition solution is applied. The glass fiber of the present embodiment in the form of a woven fabric can be coated with the organic matter by immersing the glass fiber in the treating agent composition solution and then drying the glass fiber to which the treating agent composition has been applied.

Examples of the silane coupling agent include aminosilanes, chlorosilanes, epoxysilanes, mercaptosilanes, vinylsilanes, acrylsilanes, and cationic silanes. As for the silane coupling agent, these compounds can be used alone, or two or more of them can be used in combination.

Examples of the aminosilane include γ-aminopropyltriethoxysilane, N-β-(aminoethyl)-γ-aminopropyltrimethoxysilane, N-β-(aminoethyl)-N'-β-(aminoethyl)-γ-aninopropyltrimethoxysilane, and γ-anilinopropyltrimethoxysilane.

Examples of the chlorosilane include γ-chloropropyltrimethoxysilane.

Examples of the epoxysilane include γ-glycidoxvpropyltrimethoxysilane and β-(3,4-epoxycyclohexyl)ethyltrimethoxysilane.

Examples of the mercaptosilane can include γ-mercaptotrimethoxysilane.

Examples of the vinylsilane include vinyl trimethoxysilane and N-β-(N-vinylbenzylaminoethyl)-γ-aminopropyltrimethoxysilane.

Examples of the acrylsilane include γ-methacryloxypropyltrimethoxysilane.

Examples of the cationic silane can include N-(vinylbenzyl)-2-aminoethyl-3-aminopropyltrimethoxysilane hydrochloride and N-phenyl-3-aninopropyltrimethoxysilane hydrochloride.

Examples of the lubricant include modified silicone oils, animal oils and hydrogenated products thereof, vegetable oils and hydrogenated products thereof, animal waxes, vegetable waxes, mineral waxes, condensates of a higher saturated fatty acid and a higher saturated alcohol, polyethyleneimine, polyalkylpolyamine alkylamide derivatives, fatty acid amides, and quaternary ammonium salts. As for the lubricant, these can be used alone, or two or more of them can be used in combination.

Examples of the animal oil include beef tallow.

Examples of the vegetable oil include soybean oil, coconut oil, rapeseed oil, palm oil, and castor oil.

Examples of the animal wax include beeswax and lanolin.

Examples of the vegetable wax include candelilla wax and carnauba wax.

Examples of the mineral wax include paraffin wax and montan wax.

Examples of the condensate of a higher saturated fatty acid and a higher saturated alcohol include stearates such as lauryl stearate.

Examples of the fatty acid amide include dehydrated condensates of a polyethylenepolyamine such as diethylenetriamine, triethylenetetramine, or tetraethylenepentamine and a fatty acid such as lauric acid, myristic acid, palmitic acid, or stearic acid.

Examples of the quaternary ammonium salt include allyltrimethylamnmonium salts such as lauryltrimethylammonium chloride.

Examples of the surfactant can include nonionic surfactants, cationic surfactants, anionic surfactants, and amphoteric surfactants. As for the surfactant, these can be used alone, or two or more of them can be used in combination.

Examples of the nonionic surfactant can include ethylene oxide propylene oxide alkyl ether, polyoxyethylene alkyl ether, polyoxyethylene-polyoxypropylene-block copolymer, alkyl polyoxyethylene-polyoxypropylene block copolymer ether, polyoxyethylene fatty acid ester, polyoxyethylene fatty acid monoester, polyoxyethylene fatty acid diester, polyoxyethylene sorbitan fatty acid ester, glycerol fatty acid ester ethylene oxide adduct, polyoxyethylene castor oil ether, hydrogenated castor oil ethylene oxide adduct, alkylamine ethylene oxide adduct, fatty acid amide ethylene oxide adduct, glycerol fatty acid ester, polyglycerol fatty acid ester, pentaerythritol fatty acid ester, sorbitol fatty acid ester, sorbitan fatty acid ester, sucrose fatty acid ester, polyhydric alcohol alkyl ether, fatty acid alkanolamide, acetylene glycol, acetylene alcohol, ethylene oxide adduct of acetylene glycol, and ethylene oxide adduct of acetylene alcohol.

Examples of the cationic surfactant can include alkyldimethylbenzylammonium chloride, alkyltrimethylammonium chloride, alkyl dimethyl ethyl ammonium ethyl sulfate, higher alkylamine acetate, higher alkylamine hydrochloride, adduct of ethylene oxide to a higher alkylamine, condensate of a higher fatty acid and polyalkylene polyamine, a salt of an ester of a higher fatty acid and alkanolamine, a salt of higher fatty acid amide, imidazoline cationic surfactant, and alkyl pyridinium salt.

Examples of the anionic surfactant can include higher alcohol sulfate salts, higher alkyl ether sulfate salts, α-olefin sulfate salts, alkylbenzene sulfonate salts, α-olefin sulfonate salts, reaction products of fatty acid halide and N-methyl taurine, dialkyl sulfosuccinate salts, higher alcohol phosphate ester salts, and phosphate ester salts of higher alcohol ethylene oxide adduct. Examples of the amphoteric surfactant can include amino acid amphoteric surfactants such as alkali metal salts of alkylaminopropionic acid, betaine amphoteric surfactants such as alkyldimethylbetaine, and imidazoline amphoteric surfactants.

The glass fiber woven fabric of the present embodiment includes the above glass fiber of the present embodiment. Specifically, the glass fiber woven fabric of the present embodiment can be obtained by weaving the above glass fiber of the present embodiment as at least a part of warp yarns or weft yarns with a loom known per se. Examples of the loom may include jet looms such as air jet or water jet looms, shuttle looms, and rapier looms. Examples of weaving with the loom can include plain weaving, satin weaving, mat weaving, and twill weaving; however, from the viewpoint of production efficiency, plain weaving is preferred.

In the glass fiber woven fabric of the present embodiment, the above glass fiber of the present embodiment is preferably formed by bundling glass filaments in the range of 35 to 20000 filaments, each having a diameter in the range of 3.0 to 21.0 μm, has a number of twists in the range of 0 to 1.0 twist/25 mm, and has a mass in the range of 0.9 to 600.0 tex (g/km).

In the glass fiber woven fabric of the present embodiment, in the case where the above glass fiber of the present embodiment is employed as warp yarns or weft yarns, the warp yarn weaving density is preferably in the range of 10 to 120 yarns/25 mm, and the weft yarn weaving density is preferably in the range of 10 to 120 yarns/25 mm.

The glass fiber woven fabric of the present embodiment, after woven, may be subjected to desizing treatment, surface treatment, and opening treatment.

An example of the desizing treatment can be a treatment including placing the glass fiber woven fabric in a heating oven in which the atmosphere temperature is a temperature in the range of 350° C. to 400° C. for a time period in the range of 40 to 80 hours to thereby pyrolytically decompose organic matter adhering to the glass fiber.

An example of the surface treatment can be a treatment including immersing the glass fiber woven fabric in a solution including the silane coupling agent or including the silane coupling agent and the surfactant, squeezing extra water therefrom, and heat-drying the woven fabric at a temperature in the range of 80 to 180° C. for a time period in the range of 1 to 30 minutes.

An example of the opening treatment is a treatment in which the warp yarns of the glass fiber woven fabric are subjected to opening by means of water flow pressure, opening by means of high-frequency vibration using a liquid as a medium, opening by means of the pressure of a fluid having a surface pressure, opening by means of pressing with a roll, or the like under a tension in the range of 30 to 200 N to thereby widen the width of the warp yarns and weft yarns.

The glass fiber woven fabric of the present embodiment has a mass per unit area in the range of 7.0 to 750.0 g/m$^2$ and preferably has a thickness in the range of 8.0 to 500.0 μm.

The yarn width of the warp yarns of the glass fiber woven fabric of the present embodiment is preferably in the range of 110 to 600 μm and the yarn width of the weft yarns thereof is preferably in the range of 110 to 600 μm.

The glass fiber woven fabric of the present embodiment may comprise a surface treatment layer including the silane coupling agent or the silane coupling agent and the surfactant. When the glass fiber woven fabric of the present embodiment includes the surface treatment layer, the surface treatment layer can have a mass in the range of 0.03 to 1.50% by mass, for example, with respect to the total amount of the glass fiber woven fabric including the surface treatment layer.

The glass fiber-reinforced resin composition of the present embodiment includes the above glass fiber of the present embodiment. Specifically, the glass fiber-reinforced resin composition of the present embodiment includes, for example, 10 to 90% by mass of glass fiber with respect to the total amount of the glass fiber-reinforced resin composition, as the glass fiber-reinforced resin composition including resin (thermoplastic resin or thermosetting resin), glass fiber, and other additives. Also, the glass fiber-reinforced resin composition of the present embodiment includes, for example, 90 to 10% by mass of a resin, and includes other additives in the range of 0 to 40% by mass with respect to the total amount of the glass fiber-reinforced resin composition.

Examples of the thermoplastic resin that forms the glass fiber-reinforced resin composition of the present embodiment can include the following: polyethylene, polypropylene, polystyrene, styrene/maleic anhydride resins, styrene/maleinide resins, polyacrylonitrile, acrylonitrile/styrene (AS) resins, acrylonitrile/butadiene/styrene (ABS) resins, chlorinated polyethylene/acrylonitrile/styrene (ACS) resins, acrylonitrile/ethylene/styrene (AES) resins, acrylonitrile/styrene/methyl acrylate (ASA) resins, styrene/acrylonitrile (SAN) resins, methacrylic resins, polyvinyl chloride (PVC), polyvinylidene chloride (PVDC), polyamide, polyacetal, polyethylene terephthalate (PET), polybutylene terephthalate (PBT), polytrimethylene terephthalate (PTT), polycarbonate, polyarylene sulfide, polyethersulfone (PES), polyphenylsulfone (PPSU), polyphenylene ether (PPE), modified polyphenylene ether (m-PPE), polyaryl etherketone, liquid crystal polymer (LCP), fluororesins, polyetherimide (PEI), polyarylate (PAR), polysulfone (PSF), polyamideimide (PAI), polyaminobismaleimide (PABM), thermoplastic polyimide (TPI), polyethylene naphthalate (PEN), ethylene/vinyl acetate (EVA) resins, ionomer (IO) resins, polybutadiene, styrene/butadiene resins, polybutylene, polymethylpentene, olefin/vinyl alcohol resins, cyclic olefin resins, cellulose resins, and polylactic acid.

Examples of the polyethylene can include high density polyethylene (HDPE), medium density polyethylene, low density polyethylene (LDPE), linear low density polyethylene (LLDPE), and ultra high molecular weight polyethylene.

Examples of the polypropylene can include isotactic polypropylene, atactic polypropylene, syndiotactic polypropylene, and mixtures thereof.

Examples of the polystyrene can include general-purpose polystyrene (GPPS), which is an atactic polystyrene having an atactic structure, high impact polystyrene (HIPS) with a rubber component added to GPPS, and syndiotactic polystyrene with syndiotactic structure.

Examples of the methacrylic resin can include polymers obtained by homopolymerizing one of acrylic acid, methacrylic acid, styrene, methyl acrylate, ethyl acrylate, ethyl methacrylate, butyl acrylate, butyl methacrylate, and fatty acid vinyl ester, or polymers obtained by copolymerizing two or more of these.

Examples of the polyvinyl chloride can include a vinyl chloride homopolymer, a copolymer of a vinyl chloride monomer and a copolymerizable monomer, or a graft copolymer obtained by graft polymerization of a vinyl chloride monomer to polymer polymerized by a conventionally known method such as emulsion polymerization method, suspension polymerization method, micro suspension polymerization method, or bulk polymerization method.

Examples of the polyamide can include one of the components such as polycaproamide (polyamide 6), polyhexamethylene adipamide (polyamide 66), polytetramethylene adipamide (polyamide 46), polytetramethylene sebacamide (polyamide 410), polypentamethylene adipamide (polyamide 56), polypentamethylene sebacamide (polyamide 510), polyhexamethylene sebacamide (polyamide 610), polyhexamethylene dodecamide (polyamide 612), polydecamethylene adipamide (polyamide 106), polydecamethylene sebacamide (polyamide 1010), polydecamethylene dodecamide (polyamide 1012), polyundecanamide (polyamide 11), polyundecamethylene adipamide (polyamide 116), polydodecanamide (polyamide 12), polyxylene adipamide (polyamide XD6), polyxylene sebacamide (polyamide XD10), polymetaxylylene adipamide (polyamide MXD6), polyparaxylylene adipamide (polyamide PXD6), polytetramethylene terephthalamide (polyamide 4T), polypentamethylene terephthalamide (polyamide 5T), polyhexamethylene terephthalamide (polyamide 6T), polyhexamethylene isophthalamide (polyamide 6I), polynonamethylene terephthalamide (polyamide 9T), polydecamethylene terephthalamide (polyamide 10T), polyundecamethylene terephthalamide (polyamide 11T), polydodecamethylene terephthalamide (polyamide 12T), polytetramethylene isophthalamide (polyamide 4I), polybis (3-methyl-4-aminohexyl) methane terephthalamide (polyamide PACMT), polybis(3-methyl-4-aminohexyl) methane isophthalamide (polyamide PACMI), polybis(3-methyl-4-aminohexyl) methane dodecamide (polyamide PACM12), and polybis(3-methyl-4-aminohexyl) methane tetradecamide (polyamide PACM14), or copolymers in which two or more multiple components are combined, or mixtures thereof.

Examples of the polyacetal can include a homopolymer with oxymethylene units as the main repeating unit, and a copolymer mainly consisting of oxymethylene units and containing oxyalkylene units having 2 to 8 adjacent carbon atoms in the main chain.

Examples of the polyethylene terephthalate can include a polymer obtained by polycondensation of terephthalic acid or a derivative thereof with ethylene glycol.

Examples of the polybutylene terephthalate can include a polymer obtained by polycondensation of terephthalic acid or a derivative thereof with 1,4-butanediol.

Examples of the polytrimethylene terephthalate can include polymers obtained by polycondensation of terephthalic acid or a derivative thereof with 1,3-propanediol.

Examples of the polycarbonate can include polymers obtained by a transesterification method in which a dihydroxydiaryl compound is reacted with a carbonate such as diphenyl carbonate in a molten state; or polymers obtained by phosgene method in which a dihydroxyaryl compound is reacted with phosgene.

Examples of the polyarylene sulfide can include linear polyphenylene sulfide, cross linked polyphenylene sulfide having a high molecular weight obtained by performing a curing reaction after polymerization, polyphenylene sulfide sulfone, polyphenylene sulfide ether, and polyphenylene sulfide ketone.

Examples of the modified polyphenylene ether can include: a polymer alloy of poly(2,6-dimethyl-1,4-phenylene)ether and polystyrene; a polymer alloy of poly(2,6-dimethyl-1,4-phenylene)ether and a styrene/butadiene copolymer; a polymer alloy of poly(2,6-dimethyl-1,4-phenylene) ether and a styrene/maleic anhydride copolymer; a polymer alloy of poly(2,6-dimethyl-1,4-phenylene)ether and polyamide; and a polymer alloy of poly(2,6-dimethyl-1,4-phenylene)ether and styrene/butadiene/acrylonitrile copolymer.

Examples of the polyaryl etherketone can include polyetherketone (PEK), polyetheretherketone (PEEK), polyetherketoneketone (PEKK), and polyetheretherketoneketone (PEEKK).

Examples of the liquid crystal polymer (LCP) include a polymer (copolymer) consisting of one or more structural units selected from aromatic hydroxycarbonyl units which are thermotropic liquid crystal polyesters, aromatic dihydroxy units, aromatic dicarbonyl units, aliphatic dihydroxy units, aliphatic dicarbonyl units, and the like.

Examples of the fluororesin can include polytetrafluoroethylene (PTFE), perfluoroalkoxy resins (PFA), fluorinated ethylene propylene resins (FEP), fluorinated ethylene tetrafluoroethylene resins (ETFE), polyvinyl fluoride (PVF), polyvinylidene fluoride (PVDF), polychlorotrifluoroethylene (PCTFE), and ethylene/chlorotrifluoroethylene resin (ECTFE).

Examples of the ionomer (IO) resin can include copolymers of an olefin or a styrene and an unsaturated carboxylic acid, wherein a part of carboxyl groups is neutralized with a metal ion.

Examples of the olefin/vinyl alcohol resin can include ethylene/vinyl alcohol copolymers, propylene/vinyl alcohol copolymers, saponified products of ethylene/vinyl acetate copolymers, and saponified products of propylene/vinyl acetate copolymers.

Examples of the cyclic olefin resin can include monocyclic compounds such as cyclohexene, polycyclic compounds such as tetracyclopentadiene, and polymers of cyclic olefin monomers.

Examples of the polylactic acid can include poly-L-lactic acid which is a homopolymer of L-form, poly-D-lactic acid which is a homopolymer of D-form, or a stereocomplex polylactic acid which is a mixture thereof.

Examples of the cellulose resin can include methylcellulose, ethyl cellulose, hydroxycellulose, hydroxymethylcellulose, hydroxyethyl cellulose, hydroxyethyl methylcellulose, hydroxypropylmethylcellulose, cellulose acetate, cellulose propionate, and cellulose butyrate.

Also, examples of the thermosetting resin that forms the glass fiber-reinforced resin composition of the present embodiment can include the following: unsaturated polyester resins, vinyl ester resins, epoxy (EP) resins, melamine (MF) resins, phenol resins (PF), urethane resins (PU), polyisocyanate, polyisocyanurate, polyimide (PI), urea (UF) resins, silicone (SI) resins, furan (FR) resins, benzoguanamine (BR) resins, alkyd resins, xylene resins, bismaleimide triazine (BT) resins, diallyl phthalate resin (PDAP), and thermosetting polyphenylene ether resins.

Specific examples of the unsaturated polyester resin can include resin which can be obtained by esterification reaction of aliphatic unsaturated dicarboxylic acid and aliphatic diol.

Examples of the vinyl ester resin can include bis vinyl ester resins and novolac vinyl ester resins.

Examples of the epoxy resin can include bisphenol A epoxy resins, bisphenol F epoxy resins, bisphenol E epoxy resins, bisphenol S epoxy resins, bisphenol M epoxy resins (4,4'-(1,3-phenylenediisopropylidene)bisphenol epoxy resins), bisphenol P epoxy resins (4,4'-(1,4-phenylenediisopropylidene)bisphenol epoxy resins), bisphenol Z epoxy resins (4,4'-cyclohexylidne bisphenol epoxy resins), phenol novolac epoxy resins, cresol novolac epoxy resins, tetraphenol group ethane novolac type epoxy resins, novolac epoxy resins having a condensed ring aromatic hydrocarbon structure, biphenyl epoxy resins, aralkyl epoxy resins such as xylylene epoxy resins and phenyl aralkyl epoxy resins, naphthylene ether epoxy resins, naphthol epoxy resins, naphthalene diol epoxy resins, bifunctional or tetrafunctional epoxy naphthalene resins, binaphthyl epoxy resins, naphthalene aralkyl epoxy resins, anthracene epoxy resins, phenoxy epoxy resins, dicyclopentadiene epoxy resins, norbornene epoxy resins, adamantane epoxy resins, and fluorene epoxy resins.

Examples of the melamine resin can include a polymer formed by polycondensation of melamine (2,4,6-triamino-1,3,5-triazine) and formaldehyde.

Examples of the phenolic resin can include novolac phenolic resins such as phenol novolac resins, cresol novolac resins, and bisphenol A novolac resins, resol phenol resins such as methylol resole resins and dimethylene ether resole resins, or aryl alkylene phenol resins, and include one of these or combinations of two or more.

Examples of the urea resin can include a resin obtained by condensation of urea and formaldehyde.

The above thermoplastic resin or the above thermosetting resin may be used singly or in combinations of two or more.

Examples of the above other additives can include reinforcing fiber other than glass fiber (for example, carbon fiber, metal fiber), a filler other than glass fiber (for example, glass powder, talc, mica), a flame retardant, an UV absorber, a heat stabilizer, an antioxidant, an antistatic agent, a fluidity improver, an anti-blocking agent, a lubricant, a nucleating agent, an antibacterial agent, and a pigment.

The glass fiber-reinforced resin composition of the present embodiment can be obtained, for example, by kneading the chopped strands and the resin in a twin screw kneader and performing injection molding using the obtained resin pellets.

Also, the glass fiber-reinforced resin composition may be one obtained by using known molding methods such as injection compression molding method, two-color molding method, hollow molding method, foam molding method (including supercritical fluid foam molding method), insert molding method, in-mold coating molding method, extrusion molding method, sheet molding method, thermoforming method, rotational molding method, laminate molding method, press molding method, blow molding method, stamping molding method, infusion method, hand lay-up method, spray-up method, resin transfer molding method, sheet molding compound method, bulk molding compound method, pultrusion method, and filament winding method.

Also, the glass fiber-reinforced resin composition of the present embodiment may be prepreg obtained by impregnating the glass fiber woven fabric of the present embodiment with the resin by a known method per se and semi-curing the woven fabric.

Examples of applications of molded products formed from the glass fiber-reinforced resin composition of the present embodiment can include electronic device housing, electronic components, vehicle exterior members, vehicle interior members, vehicle engine members, muffler related members, high pressure tanks, and composite materials for wind energy.

Examples of the electronic components include printed circuit boards.

Examples of the vehicle exterior members include bumpers, fenders, bonnets, air dams, and wheel covers.

Examples of the vehicle interior members include door trims and ceiling materials.

Examples of the vehicle engine members include oil pans, engine covers, intake manifolds, and exhaust manifolds.

Examples of the muffler members include silencers.

Examples of the composite materials for wind energy can include wind turbine blades.

The glass fiber of the present embodiment can be suitably used as a reinforcing material for inorganic materials such as gypsum and cement, in addition to the glass fiber-reinforced resin composition of the present embodiment. For example, when used as a reinforcing material for gypsum, especially, gypsum board having a thickness in the range of 4 to 60 mm, the glass fiber comprising the glass composition in the above range can be included in a range of 0.1 to 4.0% by mass with respect to the total mass of gypsum.

Examples and Comparative Examples of the present invention will be shown.

EXAMPLES

Examples 1 to 12 and Comparative Examples 1 to 11

For the respective glass batches prepared to have the composition of the glass compositions for glass fiber of Examples 1 to 12 shown in Tables 1 to 2 or Comparative Examples 1 to 11 shown in Tables 3 to 4, the 1000 poise temperature, liquid phase temperature, elastic modulus, and coefficient of linear thermal expansion were measured by the measurement methods described later, and the working temperature range was calculated as the difference between the 1000 poise temperature and the liquid phase temperature (working temperature range=1000 poise temperature−liquid phase temperature). In addition, for the respective glass batches, whether or not phase separation was suppressed was evaluated by the evaluation method described later. The results are shown in Tables 1 to 4.

[Measurement Method of 1000 Poise Temperature]

First, the glass batch is placed in an 80 mm diameter platinum crucible, held in an electric furnace for 4 hours at a temperature in the range of 1500 to 1650° C., and melted while stirring the glass batch to obtain a homogeneous molten glass. Next, the obtained molten glass is poured onto a carbon plate and cooled to obtain a bulk glass cullet. Then, the glass cullet was melted, and the viscosity of the molten glass is continuously measured using a Brookfield rotational viscometer while the melt temperature is varied. The temperature at which the rotational viscosity is 1000 poise is defined as the 1000 poise temperature.

[Measurement Method of Liquid Phase Temperature]

The glass cullet is pulverized, 40 g of glass particles having a particle diameter in the range of 0.5 to 1.5 mm is placed in a platinum boat of 180 mm×20 mm×15 mm and heated in a tubular electric furnace provided with a temperature gradient in the range of 900 to 1550° C. for 8 hours or longer, then taken out of the tubular electric furnace, and observed with a polarized light microscope to identify the point at which crystals derived from glass (devitrification) began to precipitate. Then, the temperature inside the tubular electric furnace is actually measured using a type B thermocouple, and the temperature of the point at which precipitation started is defined as the liquid phase temperature.

[Measurement Method of Elastic Modulus]

First, the glass batch is placed in an 80 mm diameter platinum crucible, melted by heating at a temperature of 1650° C. for 6 hours, and then taken out of the platinum crucible to obtain homogeneous glass bulk or glass cullet. The obtained glass bulk or glass cullet is then annealed by heating at a temperature of 750° C. for 8 hours to obtain a test piece. Next, the test piece is processed into a test piece for elastic modulus measurement of 50 mm×50 mm×5 mm using a cutting machine such as diamond cutter and a polisher, and using the test piece for elastic modulus measurement, the elastic modulus is measured by the ultrasonic pulse method according to JIS R 1602:1995.

[Measurement Method of Coefficient of Linear Thermal Expansion]

First, a test piece obtained in the same manner as in the case of the elastic modulus measurement described above is processed into a test piece for coefficient of linear thermal expansion measurement of 4 mm×4 mm×20 mm using a cutting machine such as diamond cutter and a polisher. Next, the obtained test piece for coefficient of linear thermal expansion measurement is heated at a temperature increase rate of 10° C./min, and the amount of elongation is measured using a coefficient of thermal expansion measuring apparatus (manufactured by NETZSCH, trade name: DIL 402) in the range of 50 to 200° C. From the amount of elongation, the coefficient of linear thermal expansion is calculated.

[Evaluation Method of Phase Separation]

First, the glass batch is placed in an 80 mm diameter platinum crucible, and melted by heating at a temperature of 1650° C. for 6 hours. Thereafter, the platinum crucible is taken out of the electric furnace and allowed to stand at room temperature for 30 minutes for cooling. Then, the cooled glass is taken out of the platinum crucible to obtain homogeneous glass bulk or glass cullet. The obtained glass bulk or glass cullet is then annealed by heating at a temperature of 750° C. for 8 hours to obtain a test piece. Next, the test piece is processed into a disc shape using a cutting machine such as diamond cutter and a polisher. Then, the test piece that has been processed into a disc shape is placed on the boundary between a black plate and a white plate, and the boundary surface between the black plate and the white plate is observed through the test piece from the top of the test piece. In the case where there is no cloudiness in the test piece and the boundary surface can be clearly observed, phase separation is evaluated as being suppressed and is indicated by "O" in Tables 1 to 4. On the other hand, in the case where cloudiness is observed in the test piece and the boundary surface cannot be clearly observed, phase separation is evaluated as not being suppressed and is indicated by "x" in Tables 1 to 4.

TABLE 1

|  | Example 1 | Example 2 | Example 3 | Example 4 | Example 5 | Example 6 |
|---|---|---|---|---|---|---|
| $SiO_2$ (% by mass) | 50.00 | 52.50 | 50.00 | 54.00 | 54.80 | 54.00 |
| $B_2O_3$ (% by mass) | 3.00 | 2.50 | 2.80 | 3.00 | 2.00 | 3.00 |
| $Al_2O_3$ (% by mass) | 24.00 | 24.00 | 24.50 | 24.00 | 24.00 | 24.00 |
| ZnO (% by mass) | 7.50 | 8.50 | 6.50 | 7.50 | 7.50 | 9.00 |
| $P_2O_5$ (% by mass) | 13.00 | 10.00 | 12.00 | 9.00 | 9.00 | 9.00 |
| MgO (% by mass) | 2.50 | 2.50 | 2.20 | 2.50 | 2.50 | 1.00 |
| CaO (% by mass) | 0.00 | 0.00 | 0.00 | 0.00 | 0.00 | 0.00 |
| $TiO_2$ (% by mass) | 0.00 | 0.00 | 2.00 | 0.00 | 0.00 | 0.00 |
| $Li_2O$ (% by mass) | 0.00 | 0.00 | 0.00 | 0.00 | 0.20 | 0.00 |
| $Na_2O$ (% by mass) | 0.00 | 0.00 | 0.00 | 0.00 | 0.00 | 0.00 |
| $K_2O$ (% by mass) | 0.00 | 0.00 | 0.00 | 0.00 | 0.00 | 0.00 |
| $Li_2O + Na_2O + K_2O$ (% by mass) | 0.00 | 0.00 | 0.00 | 0.00 | 0.20 | 0.00 |
| $P_2O_5$/ZnO | 1.73 | 1.18 | 1.85 | 1.20 | 1.20 | 1.00 |
| $(Li_2O + Na_2O + K_2O)/Al_2O_3$ | 0.00 | 0.00 | 0.00 | 0.00 | 0.01 | 0.00 |
| Total (% by mass) | 100.00 | 100.00 | 100.00 | 100.00 | 100.00 | 100.00 |
| Liquid phase temperature (° C.) | 1357 | 1407 | 1410 | 1444 | 1438 | 1457 |
| 1000 poise temperature (° C.) | 1485 | 1476 | 1463 | 1486 | 1481 | 1497 |
| Working temperature range (° C.) | 128 | 69 | 53 | 42 | 43 | 40 |
| Phase separation | ○ | ○ | ○ | ○ | ○ | ○ |
| Elastic modulus (GPa) | 80.0 | 83.4 | 80.9 | 82.9 | 84.1 | 82.2 |
| Coefficient of linear thermal expansion (ppm/° C.) | 2.0 | 2.1 | 2.0 | 2.0 | 2.0 | 2.0 |

TABLE 2

|  | Example 7 | Example 8 | Example 9 | Example 10 | Example 11 | Example 12 |
|---|---|---|---|---|---|---|
| $SiO_2$ (% by mass) | 48.50 | 55.00 | 55.00 | 52.00 | 45.00 | 58.00 |
| $B_2O_3$ (% by mass) | 6.50 | 0.00 | 4.00 | 2.50 | 3.00 | 2.00 |
| $Al_2O_3$ (% by mass) | 25.50 | 21.00 | 24.00 | 24.50 | 24.00 | 24.00 |
| ZnO (% by mass) | 3.50 | 8.00 | 4.00 | 11.00 | 7.50 | 5.00 |
| $P_2O_5$ (% by mass) | 12.00 | 10.00 | 9.00 | 10.00 | 18.00 | 7.00 |
| MgO (% by mass) | 4.00 | 6.00 | 2.00 | 0.00 | 2.50 | 4.00 |
| CaO (% by mass) | 0.00 | 0.00 | 0.00 | 0.00 | 0.00 | 0.00 |
| $TiO_2$ (% by mass) | 0.00 | 0.00 | 2.00 | 0.00 | 0.00 | 0.00 |
| $Li_2O$ (% by mass) | 0.00 | 0.00 | 0.00 | 0.00 | 0.00 | 0.00 |
| $Na_2O$ (% by mass) | 0.00 | 0.00 | 0.00 | 0.00 | 0.00 | 0.00 |
| $K_2O$ (% by mass) | 0.00 | 0.00 | 0.00 | 0.00 | 0.00 | 0.00 |
| $Li_2O + Na_2O + K_2O$ (% by mass) | 0.00 | 0.00 | 0.00 | 0.00 | 0.00 | 0.00 |
| $P_2O_5$/ZnO | 3.43 | 1.25 | 2.25 | 0.91 | 2.40 | 1.40 |
| $(Li_2O + Na_2O + K_2O)/Al_2O_3$ | 0.00 | 0.00 | 0.00 | 0.00 | 0.00 | 0.00 |
| Total (% by mass) | 100.00 | 100.00 | 100.00 | 100.00 | 100.00 | 100.00 |
| Liquid phase temperature (° C.) | 1381 | 1431 | 1467 | 1456 | 1484 | 1457 |

TABLE 2-continued

|  | Example 7 | Example 8 | Example 9 | Example 10 | Example 11 | Example 12 |
|---|---|---|---|---|---|---|
| 1000 poise temperature (° C.) | 1447 | 1480 | 1501 | 1487 | 1499 | 1505 |
| Working temperature range (° C.) | 66 | 49 | 34 | 31 | 15 | 48 |
| Phase separation | ○ | ○ | ○ | ○ | ○ | ○ |
| Elastic modulus (GPa) | 78.7 | 86.6 | 80.7 | 81.9 | 76.2 | 85.5 |
| Coefficient of linear thermal expansion (ppm/° C.) | 2.3 | 2.5 | 1.9 | 1.8 | 2.0 | 2.3 |

TABLE 3

|  | Comparative Example 1 | Comparative Example 2 | Comparative Example 3 | Comparative Example 4 | Comparative Example 5 |
|---|---|---|---|---|---|
| $SiO_2$ (% by mass) | 54.00 | 48.50 | 50.00 | 53.00 | 62.00 |
| $B_2O_3$ (% by mass) | 5.00 | 6.50 | 4.00 | 2.00 | 4.00 |
| $Al_2O_3$ (% by mass) | 17.00 | 29.00 | 20.00 | 24.00 | 20.00 |
| ZnO (% by mass) | 7.00 | 0.00 | 8.00 | 9.00 | 4.00 |
| $P_2O_5$ (% by mass) | 13.00 | 12.00 | 8.00 | 4.00 | 6.00 |
| MgO (% by mass) | 4.00 | 4.00 | 10.00 | 8.00 | 4.00 |
| CaO (% by mass) | 0.00 | 0.00 | 0.00 | 0.00 | 0.00 |
| $TiO_2$ (% by mass) | 0.00 | 0.00 | 0.00 | 0.00 | 0.00 |
| $Li_2O$ (% by mass) | 0.00 | 0.00 | 0.00 | 0.00 | 0.00 |
| $Na_2O$ (% by mass) | 0.00 | 0.00 | 0.00 | 0.00 | 0.00 |
| $K_2O$ (% by mass) | 0.00 | 0.00 | 0.00 | 0.00 | 0.00 |
| $Li_2O + Na_2O + K_2O$ (% by mass) | 0.00 | 0.00 | 0.00 | 0.00 | 0.00 |
| $P_2O_5$/ZnO | 1.86 | — | 1.00 | 0.44 | 1.50 |
| $(Li_2O + Na_2O + K_2O)/Al_2O_3$ | 0.00 | 0.00 | 0.00 | 0.00 | 0.00 |
| Total (% by mass) | 100.00 | 100.00 | 100.00 | 100.00 | 100.00 |
| Liquid phase temperature (° C.) | 1343 | 1512 | 1297 | 1328 | 1378 |
| 1000 poise temperature (° C.) | 1538 | 1451 | 1349 | 1346 | 1556 |
| Working temperature range (° C.) | 195 | −61 | 52 | 18 | 178 |
| Phase separation | x | ○ | x | ○ | ○ |
| Elastic modulus (GPa) | 75.0 | 80.5 | 87.8 | 93.1 | 80.9 |
| Coefficient of linear thermal expansion (ppm/° C.) | 2.4 | 2.1 | 3.4 | 3.2 | 2.4 |

TABLE 4

|  | Comparative Example 6 | Comparative Example 7 | Comparative Example 8 | Comparative Example 9 | Comparative Example 10 | Comparative Example 11 |
|---|---|---|---|---|---|---|
| $SiO_2$ (% by mass) | 57.00 | 48.50 | 47.00 | 52.00 | 56.00 | 61.70 |
| $B_2O_3$ (% by mass) | 0.00 | 4.00 | 0.00 | 1.00 | 0.00 | 9.00 |
| $Al_2O_3$ (% by mass) | 25.00 | 20.00 | 22.00 | 24.50 | 22.50 | 16.00 |
| ZnO (% by mass) | 2.00 | 15.00 | 7.50 | 7.00 | 17.50 | 2.60 |
| $P_2O_5$ (% by mass) | 11.00 | 7.00 | 20.00 | 10.00 | 4.00 | 0.00 |
| MgO (% by mass) | 5.00 | 5.50 | 3.50 | 3.50 | 0.00 | 7.80 |
| CaO (% by mass) | 0.00 | 0.00 | 0.00 | 0.00 | 0.00 | 0.20 |
| $TiO_2$ (% by mass) | 0.00 | 0.00 | 0.00 | 0.00 | 0.00 | 2.70 |
| $Li_2O$ (% by mass) | 0.00 | 0.00 | 0.00 | 0.00 | 0.00 | 0.00 |

TABLE 4-continued

|  | Comparative Example 6 | Comparative Example 7 | Comparative Example 8 | Comparative Example 9 | Comparative Example 10 | Comparative Example 11 |
|---|---|---|---|---|---|---|
| $Na_2O$ (% by mass) | 0.00 | 0.00 | 0.00 | 2.00 | 0.00 | 0.00 |
| $K_2O$ (% by mass) | 0.00 | 0.00 | 0.00 | 0.00 | 0.00 | 0.00 |
| $Li_2O + Na_2O + K_2O$ (% by mass) | 0.00 | 0.00 | 0.00 | 2.00 | 0.00 | 0.00 |
| $P_2O_5/ZnO$ | 5.50 | 0.47 | 2.67 | 1.43 | 0.23 | 0.00 |
| $(Li_2O + Na_2O + K_2O)/Al_2O_3$ | 0.00 | 0.00 | 0.00 | 0.08 | 0.00 | 0.00 |
| Total (% by mass) | 100.00 | 100.00 | 100.00 | 100.00 | 100.00 | 100.00 |
| Liquid phase temperature (° C.) | 1448 | 1280 | 1521 | 1378 | 1453 | 1148 |
| 1000 poise temperature (° C.) | 1540 | 1330 | 1529 | 1306 | 1445 | 1426 |
| Working temperature range (° C.) | 92 | 50 | 8 | −72 | −8 | 278 |
| Phase separation | ◯ | x | ◯ | ◯ | ◯ | ◯ |
| Elastic modulus (GPa) | 85.5 | 86.8 | 77.4 | 83.9 | 88.6 | 80.3 |
| Coefficient of linear thermal expansion (ppm/° C.) | 2.0 | 3.1 | 2.1 | 3.1 | 2.1 | 3.1 |

From Tables 1 to 2, according to the glass compositions for glass fiber of Examples 1 to 12, it is clear that glass compositions for glass fiber with a low coefficient of linear thermal expansion can be obtained that enable molten glass with a low 1000 poise temperature, a wide working temperature range, and suppressed phase separation to be obtained.

On the other hand, from Table 3, according to the glass composition for glass fiber of Comparative Example 1, in which the content of $Al_2O_3$ is 17.00% by mass, which is less than 19.00% by mass, with respect to the total amount of the glass composition for glass fiber, it is clear that the 1000 poise temperature is as high as 1538° C., which is higher than 1520° C., and phase separation cannot be suppressed.

Also, from Table 3, according to the glass composition for glass fiber of Comparative Example 2, in which the content of $Al_2O_3$ is 29.00% by mass, which is more than 27.30% by mass, with respect to the total amount of the glass composition for glass fiber, and the content of ZnO is 0.00% by mass, which is less than 3.00% by mass, with respect to the total amount of the glass composition for glass fiber, it is clear that the working temperature range is as low as −61° C., which is less than 0° C.

Also, from Table 3, according to the glass composition for glass fiber of Comparative Example 3, in which the content of MgO is 10.00% by mass, which is more than 7.00% by mass, with respect to the total amount of the glass composition for glass fiber, it is clear that phase separation cannot be suppressed and the coefficient of linear thermal expansion is as large as 3.4 ppm/° C., which is more than 3.0 ppm/° C.

Also, from Table 3, according to the glass composition for glass fiber of Comparative Example 4, in which the content of MgO is 8.00% by mass, which is more than 7.00% by mass, with respect to the total amount of the glass composition for glass fiber, it is clear that the coefficient of linear thermal expansion is as large as 3.2 ppm/° C., which is more than 3.0 ppm/° C.

Also, from Table 3, according to the glass composition for glass fiber of Comparative Example 5, in which the content of $P_2O_5$ is 6.00% by mass, which is less than 6.50% by mass, with respect to the total amount of the glass composition for glass fiber, it is clear that the 1000 poise temperature is as high as 1556° C., which is higher than 1520° C.

Also, from Table 4, according to the glass composition for glass fiber of Comparative Example 6, in which the content of ZnO is 2.00% by mass, which is 3.00% by mass or less, with respect to the total amount of the glass composition for glass fiber, it is clear that the 1000 poise temperature is as high as 1540° C., which is higher than 1520° C.

Also, from Table 4, according to the glass composition for glass fiber of Comparative Example 7, in which the content of ZnO is 15.00% by mass, which is more than 13.00% by mass, with respect to the total amount of the glass composition for glass fiber, it is clear that phase separation cannot be suppressed and the coefficient of linear thermal expansion is as large as 3.1 ppm/° C., which is more than 3.0 ppm/° C.

Also, from Table 4, according to the glass composition for glass fiber of Comparative Example 8, in which the content of $P_2O_5$ is 20.00% by mass, which is more than 19.00% by mass, with respect to the total amount of the glass composition for glass fiber, it is clear that the 1000 poise temperature is as high as 1529° C., which is higher than 1520° C.

Also, from Table 4, according to the glass composition for glass fiber of Comparative Example 9, in which the total content of $Li_2O$, $Na_2O$, and $K_2O$ is 2.00% by mass, which is more than 1.00% by mass, with respect to the total amount of the glass composition for glass fiber, it is clear that the working temperature range is as low as −72° C., which is less than 0° C., and the coefficient of linear thermal expansion is as large as 3.1 ppm/° C., which is more than 3.0 ppm/° C.

Also, from Table 4, according to the glass composition for glass fiber of Comparative Example 10, in which the content of ZnO is 17.50% by mass, which is more than 13.00% by mass, with respect to the total amount of the glass composition for glass fiber, it is clear that the working temperature range is as low as −8° C., which is less than 0° C.

Furthermore, from Table 4, according to the glass composition for glass fiber of Comparative Example 11, in which the content of $Al_2O_3$ is 16.00% by mass, which is less than 19.00% by mass, with respect to the total amount of the glass composition for glass fiber, the content of ZnO is 2.60% by mass, which is 3.00% by mass or less, with respect to the total amount of the glass composition for glass fiber, the content of $P_2O_5$ is 0.00% by mass, which is less than 6.50% by mass, with respect to the total amount of the glass composition for glass fiber, and the content of MgO is 7.80% by mass, which is more than 7.00% by mass, with respect to is clear that the coefficient of linear thermal expansion is as large as 3.1 ppm/° C., which is more than 3.0 ppm/° C.

Example 13

A glass raw material was mixed to obtain a glass batch so that the glass composition after melt-solidification was the same as the composition of Example 1. Then, the glass batch was melted at 1630° C., and the obtained melt was discharged from a bushing having a nozzle plate with 200 nozzle tips formed therein, and cooled while stretched by winding at a predetermined speed to be solidified into glass single fiber (glass filament) comprising a perfect circular section and a fiber diameter of 7 μm. The obtained 200 glass filaments were bundled by applying a bundling agent to them with an applicator, and then wound on a collet to obtain a glass fiber bundle. After continuously performing a series of operations (spinning) for 6 hours, no glass fiber cuts occurred, and no nozzle clogging occurred.

Comparative Example 12

A glass raw material was mixed to obtain a glass batch so that the glass composition after melt-solidification was the same as the composition of Comparative Example 10. Then, the glass batch was melted at 1630° C., and the obtained melt was discharged from a bushing having a nozzle plate with 200 nozzle tips formed therein, and cooled while stretched by winding at a predetermined speed to be solidified into glass single fiber (glass filament) comprising a perfect circular section and a fiber diameter of 7 μm. The obtained 200 glass filaments were bundled by applying a bundling agent to them with an applicator, and then wound on a collet to obtain a glass fiber bundle. After continuously performing a series of operations (spinning) for 6 hours, glass fiber cuts occurred 20 or more times. In addition, nozzle clogging occurred in 100 or more nozzle tips out of 200 nozzle tips, making it difficult to continue the spinning operation and obtain the predetermined glass fiber.

From Example 13 and Comparative Example 12, it was confirmed that the glass composition for glass fiber of the present invention can produce glass single fiber and glass fiber bundle while suppressing cuts thereof. In addition, while durability for industrial production is assured if the number of times the glass fiber is cut is 7 times or less and no nozzle clogging occurs when spinning is continued for 6 hours, the glass composition for glass fiber of the present invention was confirmed to sufficiently meet this level. Note that, in the case where glass fiber is produced industrially, the number of times the glass fiber is cut when spinning is continued for 6 hours is preferably 5 times or less, more preferably 3 times or less, and still more preferably 1 time or less.

The invention claimed is:

1. Glass fiber formed from a glass composition for glass fiber, the glass composition comprising:
 $SiO_2$ in a range of 42.00 to 63.00% by mass,
 $Al_2O_3$ in a range of 19.00 to 27.30% by mass,
 ZnO in a range of more than 3.00% by mass and 13.00% by mass or less,
 $P_2O_5$ in a range of 6.50 to 19.00% by mass,
 MgO in a range of 0.00 to 7.00% by mass, and
 $Li_2O$, $Na_2O$, and $K_2O$ in a range of 1.00% by mass or less in total, with respect to the total amount.

2. A glass fiber woven fabric comprising the glass fiber according to claim 1.

3. A glass fiber-reinforced resin composition comprising the glass fiber according to claim 1.

4. The glass fiber formed from the glass composition for glass fiber according to claim 1, comprising ZnO in a range of 5.10 to 10.00% by mass, $P_2O_5$ in a range of more than 8.00% by mass and 15.50% by mass or less, and $B_2O_3$ in a range of 1.00 to 4.80% by mass, with respect to the total amount.

5. The glass fiber formed from the glass composition for glass fiber according to claim 1, comprising ZnO in a range of 7.00 to 8.80% by mass and $P_2O_5$ in a range of 9.50 to 13.50% by mass, with respect to the total amount.

\* \* \* \* \*